(12) United States Patent
Hedler et al.

(10) Patent No.: US 7,646,090 B2
(45) Date of Patent: Jan. 12, 2010

(54) SEMICONDUCTOR MODULE FOR MAKING ELECTRICAL CONTACT WITH A CONNECTION DEVICE VIA A REWIRING DEVICE

(75) Inventors: Harry Hedler, Germering (DE); Roland Irsigler, Munich (DE); Thorsten Meyer, Regensburg (DE)

(73) Assignee: Infineon Technologies AG, Munich (DE)

( * ) Notice: Subject to any disclaimer, the term of this patent is extended or adjusted under 35 U.S.C. 154(b) by 210 days.

(21) Appl. No.: 11/364,770

(22) Filed: Feb. 28, 2006

(65) Prior Publication Data

US 2006/0177964 A1 Aug. 10, 2006

Related U.S. Application Data

(63) Continuation of application No. PCT/EP2004/010893, filed on Sep. 29, 2004.

(30) Foreign Application Priority Data

Sep. 30, 2003 (DE) .................... 103 45 395

(51) Int. Cl.
- H01L 23/04 (2006.01)
- H01L 23/12 (2006.01)
- H01L 23/053 (2006.01)
- H01L 23/48 (2006.01)

(52) U.S. Cl. .............. 257/698; 257/700; 257/738; 257/E23.005; 257/E23.021

(58) Field of Classification Search ........... 257/698, 257/700, 738, E23.005, E23.021
See application file for complete search history.

(56) References Cited

U.S. PATENT DOCUMENTS

| 6,211,572 | B1 | 4/2001 | Fjelstad et al. |
| 6,242,799 | B1 | 6/2001 | Horiuchi et al. |
| 6,313,532 | B1 | 11/2001 | Shimoishizaka |
| 6,624,504 | B1 | 9/2003 | Inoue et al. |
| 6,927,489 | B1 | 8/2005 | Yaguchi et al. |
| 2002/0079575 | A1 | 6/2002 | Hozoji et al. |

FOREIGN PATENT DOCUMENTS

| DE | 100 59 178 | 6/2002 |
| EP | 1143515 | 10/2001 |
| WO | WO 00/55910 | 9/2000 |

OTHER PUBLICATIONS

German Office Action dated Jul. 13, 2004.
International Search Report and Notification of Transmittal with Written Opinion dated Aug. 31, 2005.
PCT International Preliminary Report on Patentability and Notification of Transmittal dated Jun. 22, 2006.

*Primary Examiner*—Ngan Ngo
(74) *Attorney, Agent, or Firm*—Fay Kaplun & Marcin, LLP

(57) ABSTRACT

The present invention provides a semiconductor module having: a semiconductor device (10) having a contact device (11) for making electrical contact with a connection device (17; 20) via a rewiring device (15, 15', 15"); and a carrier device (12, 13, 14) for mechanically coupling the semiconductor device (10) to a connection device (17), the carrier device (12, 13, 14) having a gradient between a first modulus of elasticity at the semiconductor device (10) and a second, higher modulus of elasticity at the connection device (17; 20). The present invention likewise provides a method for producing a semiconductor module.

19 Claims, 2 Drawing Sheets

SEMICONDUCTOR MODULE FOR MAKING ELECTRICAL CONTACT WITH A CONNECTION DEVICE VIA A REWIRING DEVICE

RELATED APPLICATIONS

This application is a continuation of PCT patent application number PCT/EP2004/010893, filed Sep. 29, 2004, which claims priority to German patent application number 10345395.4 filed Sep. 30, 2003, the disclosures of each of which are incorporated herein by reference in their entirety.

The present invention relates to a semiconductor module and a method for producing a semiconductor module, and in particular a wafer level package and a method for producing a wafer level package.

Semiconductor modules, that is to say in particular semiconductor chips which are ready for connection, e.g. to a printed circuit board, in a semiconductor package, require a high reliability. What is crucial in this case is not only that an individual module can reliably provide all the functions envisaged, but moreover provides a reliable, permanently stable electrical contact-connection, for example to a printed circuit board.

It is known to link a semiconductor chip by means of a so-called interposer. In this case, the chip is mounted on to a rigid interposer and electrically connected thereto. For the electrical connection between chip and interposer, a bonding wiring, for example, is used in the case of a face-up configuration, a flip-chip rewiring device being used in the case of a face-down configuration. In this case, the interposer fulfills the functions of a buffer device with respect to thermomechanical stresses based on different coefficients of thermal expansion of the chip/interposer and the printed circuit board. If the interposer is embodied in multilayer fashion, for example a metallic shielding layer being provided, the possibility of impedance matching of the semiconductor module or package to an overall system is possible. For connection to a printed circuit board, for example, the interposer usually has a matrix of solder balls (ball grid array) on its underside. What is problematic about such an interposer-based solution is the high overall height of the construction on account of the interposer and also cost-intensive production.

Chip packages without an interposer, so-called wafer level packages, are furthermore known. In the case of a wafer level package, a patterned rewiring layer with conductor tracks is applied on the active chip surface over a passivation layer. As connection device or interconnect, for example to a printed circuit board, solder balls are applied in predetermined sections of the rewiring device. Impedance matching mentioned above is not possible in the case of such packages. Furthermore, they do not have a high connection reliability since they do not have an intermediate layer or an intermediate element between the semiconductor chip and a printed circuit board, for example. If an elastic intermediate layer were provided, then the problem would arise that said layer would either be too hard, which is detrimental to the reliability of the connection, or it would be too soft, which, in the event of mechanical loading, would result in a shearing away or tearing out of the solder balls on the elastic layer.

Therefore, it is an object of the present invention to provide a semiconductor module and also a method for producing a semiconductor module which can be permanently reliably electrically contact-connected, preferably has low losses at high clock frequencies and can be realized cost-effectively.

According to the invention, this object is achieved by means of the semiconductor module specified in Claim 1 and by means of the method for producing a semiconductor module according to Claim 12.

The idea on which the present invention is based essentially consists in providing a carrier device on a semiconductor device or a chip, which carrier device has a predetermined gradient from a low modulus of elasticity at the semiconductor device to a high modulus of elasticity at a connection device. The utilization of the functionality of an interposer, preferably with regard to its properties with possible impedance matching, and also a gradient in the modulus of elasticity of the carrier device are advantageously combined in this way.

This is preferably effected by means of a multilayer layer system on the semiconductor device or the chip, the layer sequence being characterized by a gradient $\geq$zero in the modulus of elasticity in order to obtain a high reliability in the event of a later electrical connection. In this case, a soft elastic layer having a small modulus of elasticity is applied directly to the chip. A harder layer is subsequently applied, etc., until a last hard layer of the carrier device is applied, on which a connection device, preferably solder balls, is applied. Said last hard layer has, in particular, the thermal expansion properties of a printed circuit board material and a high mechanical stability in order to be able to fix the connection device fixedly against shear/compressive/tensile stress. The last hard layer thus forms a fixed clod which is fitted on a circuit and is flexible in the direction of the semiconductor chip.

In principle, however, a monolayer carrier device is also provided between a semiconductor device and a connection device in accordance with the present invention, this layer having a modulus of elasticity with a corresponding gradient $\geq$zero from the semiconductor chip to the connection device, that is to say a continuously rising modulus of elasticity (rising hardness).

In the present invention, the problem mentioned in the introduction is solved in particular by virtue of the fact that a semiconductor module is provided having: a semiconductor device having a contact device for making electrical contact with a connection device via a rewiring device; and a carrier device for mechanically coupling the semiconductor device to the connection device, the carrier device having a gradient between a first modulus of elasticity at the semiconductor device and a second, higher modulus of elasticity at the connection device.

Advantageous developments and refinements of the respective subject matter of the invention are found in the subclaims.

In accordance with one preferred development, the carrier device has at least two non-conductive layers preferably three non-conductive layers.

In accordance with a further preferred development, the gradient of the modulus of elasticity has a stepped or linear profile.

In accordance with a further preferred development, a patterned or large-area, conductive layer is provided at least between two layers.

In accordance with a further preferred development, a rewiring device which is electrically conductively connected to the contact device of the semiconductor device is provided on and/or within the carrier device.

In accordance with a further preferred development, the connection device has elastic contact elevations, preferably with a contact tip, which are electrically contact-connected to the rewiring device.

In accordance with a further preferred development, the connection device has solder balls, preferably for connection to a printed circuit board.

In accordance with a further preferred development, the first modulus of elasticity of the carrier device is less than 5 MPa and the second modulus of elasticity of the carrier device is greater than 50 MPa.

In accordance with a further preferred development, the carrier device has silicone and also preferably epoxy resin as a covering layer, in particular with a patterned solder resist layer.

In accordance with a further preferred development, the side areas of the carrier device have a finite slope, preferably a slope of less than 4.

In accordance with a further preferred development, the semiconductor device is formed by a memory device, preferably a DRAM.

In accordance with a further preferred development, the production of the carrier device has at least one printing step for applying at least one non-conductive layer.

In accordance with a further preferred development, in order to produce the carrier device, a plurality of non-conductive layers are applied successively to the semiconductor device, which in each case have a smaller area than an underlying layer.

In accordance with a further preferred development, the gradient of the modulus of elasticity of the carrier device is produced by introducing a rising proportion of filler in a silicone.

Exemplary embodiments of the invention are illustrated in the drawings and are explained in more detail in the description below.

In the figures.

In the figures, identical reference symbols designate identical or functionally identical constituent parts.

Figure 1:
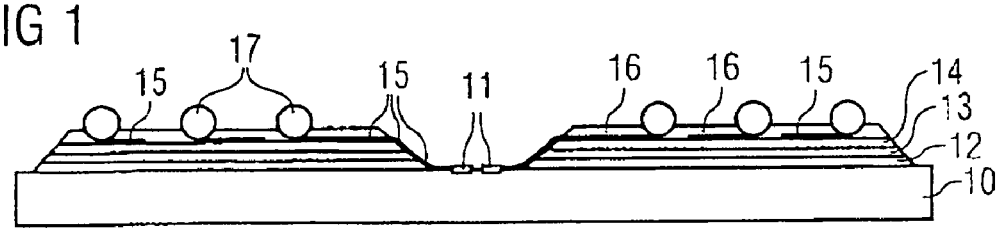
FIG. 1 shows a schematic cross-sectional view of a semiconductor module for elucidating a first embodiment of the present invention.

In the cross section in accordance with FIG. 1, a semiconductor device 10, preferably a memory device, such as a DRAM, is provided, which has a contact device 11. In accordance with the embodiment in FIG. 1, a first, non-conductive layer 12 is deposited over this, with the contact device 11 being left free, said contact device being arranged on the semiconductor device 10 in the direction of the non-conductive layer 12. The non-conductive layer 12 is preferably formed from silicone and has a low modulus of elasticity of preferably less than 5 MPa, for example 3 MPa. The non-conductive layer 12 is preferably printed on in a printing process and has a finite slope, preferably ≦four, at its side areas.

A similar, non-conductive layer 13 is applied over this, but said layer has a higher modulus of elasticity, for example 20 MPa, and in terms of its area is made smaller than the non-conductive layer 12. The non-conductive layer 13, too, is preferably printed on and preferably has correspondingly shallow side edges. A non-conductive layer 14 is arranged over the non-conductive layer 13 and has an even higher modulus of elasticity than the non-conductive layer 13, preferably >100 MPa, e.g. 1 GPa. The non-conductive layer 14 preferably comprises epoxy resin and has an even smaller area than the non-conductive layer 13. The non-conductive layer 14, too, preferably has correspondingly shallow side edges. A trough is thus produced in a central region over the contact device 11 and enables contact to be made with the contact device 11 of the semiconductor device 10.

A conductive rewiring device 15 is thereupon applied on the non-conductive layer 14 and patterned, the rewiring device 15 making electrical contact with the contact device 11 of the semiconductor device 10. A solder resist layer 16 is thereupon applied to the patterned rewiring device 15 in predetermined sections. A connection device 17, preferably solder balls, is applied to the rewiring device 15 in predetermined sections which are not covered by the solder resist layer 16. The solder resist layer 16, too, preferably has shallowly rising side edges.

Figure 2:
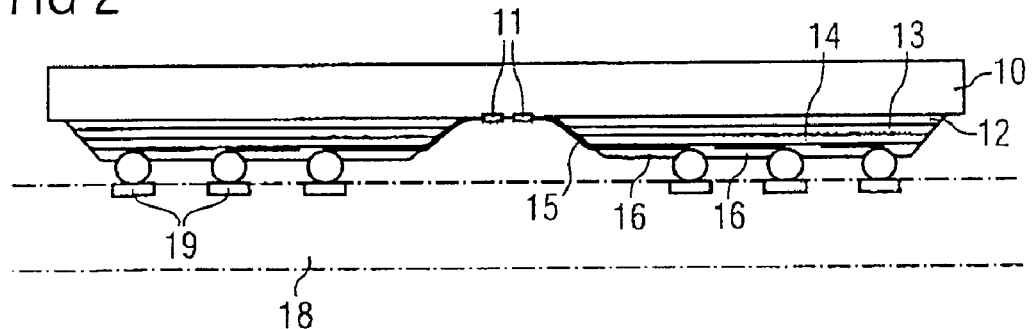
FIG. 2 shows a schematic cross-sectional view of the arrangement in accordance with FIG. 1, applied on a printed circuit board.

In the arrangement in accordance with FIG. 2, the configuration in accordance with FIG. 1 is applied head first to a printed circuit board 18 or the like. For this purpose, contact elements 19 of the printed circuit board 18 are electrically contact-connected to the semiconductor device 10, preferably after the reflow of the solder balls 17. Such a multilayer system with correspondingly dimensioned moduli of elasticity provides stress compensation when thermal expansions or length changes occur, a high mechanical stability of the connection device 17 being present. A hard link (high modulus of elasticity) as the last layer of the carrier device 12, 13, 14 distributes the entire force in the event of external mechanical loading over the area of the carrier device.

A typical linear expansion of a semiconductor device is for example CTE chip of approximately 3 ppm/K, a printed circuit board having for example a linear expansion CTE board of approximately 15 to 18 ppm/K. This can lead to strong gravitational and bending forces in the event of a change in temperature. As a result of the decoupling between semiconductor device 10 and printed circuit board 18, said decoupling being provided by means of the carrier device 12, 13, 14 with the corresponding elasticity gradient, a thermomechanical effect, such as shearing, for example, is not transmitted, or is transmitted only to a limited extent, to the connection device 17, preferably a solder ball arrangement.

The surface of the carrier device 12, 13, 14 including the connection device 17 is at rest, that is to say rigid, with respect to the printed circuit board 18 or with respect to the board in which it is mechanically and electrically contact-connected. Only the layers 12, 13, which have a low modulus of elasticity and are nearest to the semiconductor device 10, move on account of the different coefficients of thermal expansion in all three spatial directions (x, y and z directions) in the event of temperature changes. The layer having the lowest modulus of elasticity moves to the greatest extent, which is the non-conductive layer 12 in the embodiment in accordance with FIG. 1 and FIG. 2.

The embodiment in accordance with FIG. 1 and FIG. 2 thus shows an example illustrating a gradient adaptation between the semiconductor device 10 and the printed circuit board 18 on a three-layer dielectric having the non-conductive layers 12, 13, 14. In this case, the semiconductor device 10 preferably has a center line pad layout. Conductor tracks of the rewiring device 15 run from the contact device 11 at the bottom on the inner side to the connection device toward the top on the outer side via the layer sequence 12, 13, 14 having the described gradient of the modulus of elasticity. The layer sequence 12, 13, 14, which forms the carrier device in accordance with FIG. 1 and FIG. 2, preferably has shallow outer edges on which the rewiring device 15 partly runs.

Suitable materials for the layer sequence 12, 13 are silicones which have small moduli of elasticity, such as 3 MPa, for example, and which can be varied by means of a filler to a modulus of elasticity of above 100 MPa. A hard epoxy resin is preferably suitable as non-conductive terminating layer 14. The printing method, which can be realized in a cost-effective manner, is suitable in particular for applying the non-conductive layers 12, 13, 14. Furthermore, gentle, preferably S-shaped, edges with a small slope are produced in this case, so that conductor tracks of the rewiring device 15 also have a finite slope and a gradual change in slope upon a transition from one plane or layer to the next.

Figure 3:
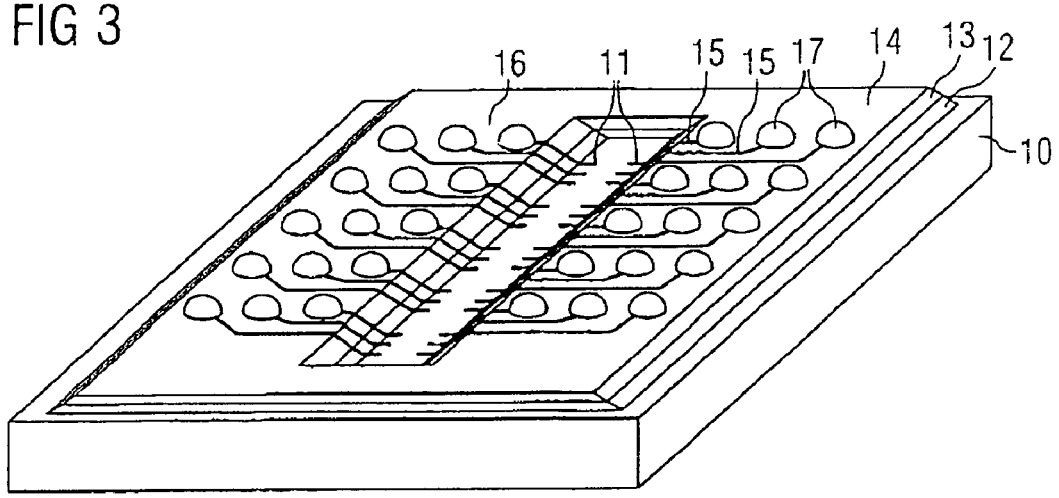
FIG. 3 shows a schematic oblique/plan view of a semiconductor module in accordance with FIG. 1 for elucidating the first embodiment of the present invention.

FIG. 3 illustrates the embodiment in accordance with FIG. 1 in an oblique/plan view. Although the individual layers 12, 13, 14, 16 in the illustration in accordance with FIG. 3 are shown in large-area and continuous fashion and are thus laterally completely contiguous, in principle there is also the possibility of forming these layers into individual islands lying next to one another.

Figure 4:
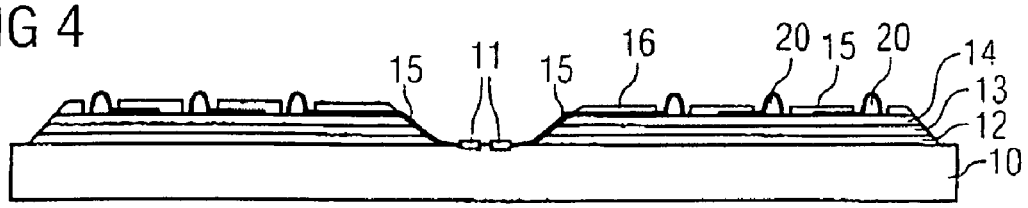
FIG. 4 shows a schematic cross-sectional view of a semiconductor module for elucidating a second embodiment of the present invention.

FIG. 4 illustrates an arrangement which differs from the arrangement in accordance with FIG. 1 in that contact elevations 20, which are preferably elastically deformable, are applied prior to the application of the rewiring device 15 to the non-conductive layer 14, which has a high modulus of elasticity. The rewiring device 15 is thereupon applied and patterned, the contact elevations 20 preferably also being provided with a patterned and thus preferably elastically deformable, conductive link. The rewiring device 15 likewise makes contact with the contact device 11 of the semiconductor device 10. A solder resist layer 16 in accordance with FIG. 1 is thereupon preferably applied.

Figure 5:
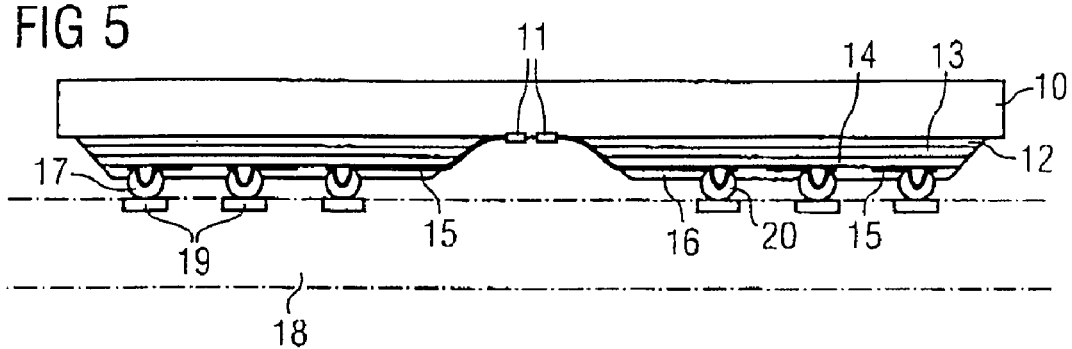
FIG. 5 shows a schematic cross-sectional view of the arrangement in accordance with FIG. 4, applied on a printed circuit board.

In order to mount the configuration in accordance with FIG. 4 onto a printed circuit board 18 in accordance with FIG. 5 with contact being made with contact pads 19 of the printed circuit board 18, solder balls 17 corresponding to FIG. 2 are preferably used as connection device 17, 20. The solder balls 17 are applied to the contact elevations 20 that are preferably provided with a rewiring device 15, as a result of which an electrically conductive connection is produced. The preferably elastically deformable contact elevations 20 comprise a non-conductive silicone, for example, there being the possibility of providing the contact elevations 20 from a conductive material, such as, for example, a conductive adhesive or a conductive polymer.

The first embodiment in accordance with FIG. 4 realizes an arrangement which, by means of the preferably elastically deformable contact elevations with a corresponding rewiring device, a simple and reliable contact is provided for a test of the semiconductor device 10. If the surface of the rewiring device 15 and thus preferably the tip on the contact elevations 20 comprises gold, then it is possible to obtain a gold/gold contact suitable for high frequency between the chip 10 to be tested and a test device (not illustrated) for carrying out a test series.

Such a contact, which initially has no solder, and thus in particular no lead, is advantageous particularly in the case of memories in which a test is also carried out under elevated temperature (burn-in). It is not necessary for solder balls to be contact-connected or tapped off, rather the test device, that is to say the corresponding contact partner of the wafer level package to be tested, is provided by a simple, flat contact pad. This results in a considerable cost saving during a test of the wafer level package on account of the omission of tips and tweezers, that is to say a transition, with respect to flat contact devices of the test device. The contact elevations 20 in accordance with FIG. 1 are preferably elastic and operate as a spring element during a test. It is not until during mounting onto a printed circuit board that solder is used in accordance with FIG. 5.

Figure 6:
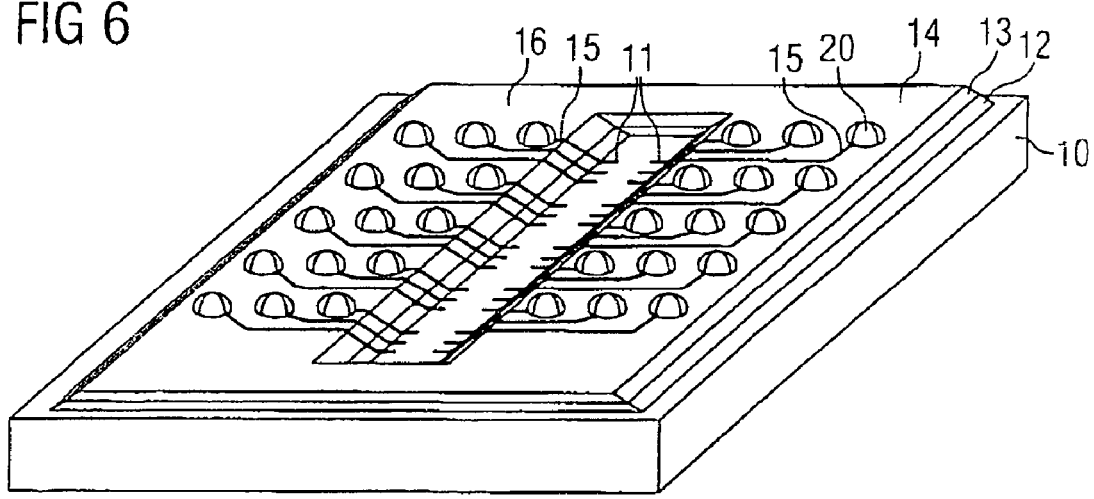
FIG. 6 shows a schematic oblique/plan view of a semiconductor module in accordance with FIG. 4 for elucidating the second embodiment of the present invention.

FIG. 6 illustrates a schematic oblique/plan view of the arrangement in accordance with FIG. 4. It reveals, in particular, the—preferably elastically deformable—contact elevations 20, which is illustrated with a patterned rewiring device 15 also over the contact elevations 20. In a test, such a wafer level package in accordance with FIG. 6 can be pressed simply onto a planar test contact device in order to ensure that electrical contact is made with the semiconductor device 10.

Figure 7:
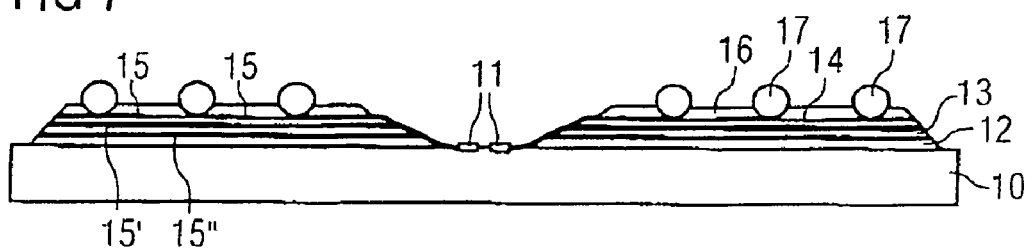
FIG. 7 shows a schematic cross-sectional view of a semiconductor module for elucidating a third embodiment of the present invention.

FIG. 7 illustrates a further preferred embodiment of the present invention. The configuration in accordance with FIG. 7 differs from the arrangement in accordance with FIG. 1 in particular in that a conductive layer 15" is applied and patterned between the first non-conductive layer 12 and the second non-conductive layer 13. Said conductive layer 15" preferably serves as a rewiring device in the direction of the plane of the drawing (y direction). In addition, a conductive layer 15' is applied between the second non-conductive layer 13 and the third non-conductive layer 14, which conductive layer serves as a shielding plane and is patterned according to the profile (lateral extent, cutout) of the layer sequence 12, 13, 14. In this case, the rewiring device 15 on the third non-conductive layer 14 is preferably provided with conductor tracks parallel to the plane of the drawing (x direction). As a result of the provision of the different metal layers 15, 15', 15", such a multilayer system provides the possibility of impedance matching and/or shielding of the conductor tracks.

In accordance with the embodiment in FIG. 7, a soft insulation layer 12 having a modulus of elasticity of 3 MPa, for example, is applied on the semiconductor device 10, for example. Over said insulation layer there follows a conductor track plane 15" running perpendicular to the plane of the drawing, for example. Arranged over that is a harder insulation layer 13 having a modulus of elasticity of 30 MPa, for example. Provided in turn over that is a continuous conductive layer 15' serving as a reference potential plane or ground plane, for example. A hard insulation layer 14 having a modulus of elasticity of more than 1 GPa, for example, is provided on said reference potential plane 15'. On said insulation layer 14 there follows a rewiring device 15 having conductor tracks parallel to the plane of the drawing, for example. A patterned solder resist layer 16 is applied thereto.

In this way, it is possible to provide a both mechanically and electrically decoupled package which can be realized such that it is very flat and ensures minimum conductor track lengths. By virtue of the possibility of matching the hard, non-conductive layer 14 thermomechanically to the properties of a printed circuit board, that is to say for example both have a comparable coefficient of thermal expansion of, in particular, CTE approximately 18 ppm/K, it is possible in addition to use smaller solder balls compared with the prior art. The dimensioning of the solder balls previously followed the specification of a safety distance in order to ensure a thermomechanical reliability. According to the present invention, this function does not have to be provided any longer by the solder balls or bumps, which has the result that flat solderings are performed which in turn reduce the package on the printed circuit board in the vertical extent.

Although the present invention has been described above on the basis of preferred exemplary embodiments, it is not restricted thereto, but rather can be modified in diverse ways. Even though only discrete layers with a rising modulus of elasticity between the semiconductor device and a connection device have been described, there is the possibility also of providing a single, non-conductive layer which has fluid transition of a rising modulus of elasticity. Furthermore, materials and dimensioning relationships mentioned are to be regarded as by way of example.

LIST OF REFERENCE SYMBOLS

10 Semiconductor device, preferably memory, such as DRAM
11 Contact device of the semiconductor device
12 Non-conductive layer having low modulus of elasticity
13 Non-conductive layer having medium modulus of elasticity
14 Non-conductive layer having high modulus of elasticity
15 Rewiring device, e.g. in x direction
15' Conductive device, preferably shielding plane
15" Rewiring device, e.g. in y direction
16 Solder resist layer
17 Connection device, preferably solder balls
18 Printed circuit board
19 Contact element of the printed circuit board
20 Elastic contact elevation

The invention claimed is:

1. Semiconductor module having:
   a semiconductor device having a contact device for making electrical contact with a connection device via a rewiring device; and
   a carrier device for mechanically coupling the semiconductor device to the connection device, the carrier device comprising a subunit arranged between the semiconductor device and the connection device, wherein the subunit has a gradient between a first modulus of elasticity at the semiconductor device and a second, higher modulus of elasticity at the connection device.

2. Semiconductor module according to claim 1, characterized in that the subunit of the carrier device has at least two non-conductive layers.

3. Semiconductor module according to claim 1, characterized in that the gradient of the modulus of elasticity has a stepped or linear profile.

4. Semiconductor module according to claim 2, characterized in that a patterned or large-area, conductive layer is provided at least between two layers.

5. Semiconductor module according to claim 1, characterized in that a rewiring device which is electrically conductively connected to the contact device of the semiconductor device is one of provided on the carrier device and provided within the carrier device.

6. Semiconductor module according to claim 4, characterized in that the connection device has elastic contact elevations which are electrically contact-connected to the rewiring device.

7. Semiconductor module according to claim 1, characterized in that the connection device has solder balls.

8. Semiconductor module according to claim 1, characterized in that the first modulus of elasticity of the carrier device is less than 5 MPa and the second modulus of elasticity of the carrier device is greater than 50 MPa.

9. Semiconductor module according to claim 1, characterized in that the carrier device has silicone as a covering layer.

10. Semiconductor module according to claim 1, characterized in that the side areas of the carrier device have a finite slope.

11. Semiconductor module according to claim 1, characterized in that the semiconductor device is formed by a memory device.

12. The semiconductor module of claim 2, wherein the subunit of the carrier device has three non-conductive layers.

13. The semiconductor module of claim 2, wherein a furthest one of the at least two non-conductive layers that is furthest from the semiconductor device is at least partially covered by a surface of the rewiring device facing the semiconductor device.

14. The semiconductor module of claim 6, wherein the elastic contact elevations have a contact tip.

15. The semiconductor module of claim 7, wherein the solder balls are for connection to a printed circuit board.

16. The semiconductor module of claim 9, wherein the carrier device further includes epoxy resin as a further covering layer.

17. The semiconductor module of claim 15, wherein the carrier device further includes a patterned solder resist layer.

18. The semiconductor module of claim 10, wherein the finite slope is less than 4.

19. The semiconductor device of claim 11, wherein the memory device is a DRAM.

* * * * *